United States Patent
Chen et al.

(10) Patent No.: US 9,041,159 B2
(45) Date of Patent: May 26, 2015

(54) EPITAXIAL STRUCTURE AND EPITAXIAL GROWTH METHOD FOR FORMING EPITAXIAL LAYER WITH CAVITIES

(71) Applicant: LEXTAR ELECTRONICS CORPORATION, Hsinchu (TW)

(72) Inventors: Jun-Rong Chen, Taichung (TW); Hsiu-Mei Chou, Hsinchu (TW); Jhao-Cheng Ye, Citong Township (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 13/932,665

(22) Filed: Jul. 1, 2013

(65) Prior Publication Data
US 2014/0008766 A1 Jan. 9, 2014

(30) Foreign Application Priority Data
Jul. 6, 2012 (TW) ............................. 101124450 A

(51) Int. Cl.
| | |
|---|---|
| *H01L 29/06* | (2006.01) |
| *H01L 33/02* | (2010.01) |
| *H01L 33/00* | (2010.01) |
| *H01L 33/12* | (2010.01) |
| *H01L 21/02* | (2006.01) |
| *C30B 23/04* | (2006.01) |
| *C30B 25/04* | (2006.01) |
| *C30B 29/40* | (2006.01) |

(52) U.S. Cl.
CPC .............. *H01L 33/02* (2013.01); *H01L 33/007* (2013.01); *H01L 33/12* (2013.01); *H01L 21/02458* (2013.01); *H01L 21/0254* (2013.01); *H01L 21/02639* (2013.01); *H01L 21/0265* (2013.01); *C30B 23/04* (2013.01); *C30B 25/04* (2013.01); *C30B 29/406* (2013.01)

(58) Field of Classification Search
CPC .................................. C30B 23/04; C30B 25/04
USPC .............. 257/618, E21.09; 438/478; 117/223
See application file for complete search history.

(56) References Cited

U.S. PATENT DOCUMENTS

| | | | |
|---|---|---|---|
| 7,435,666 B2 | 10/2008 | Park | |
| 7,445,673 B2 | 11/2008 | Beaumont et al. | |
| 7,560,364 B2 | 7/2009 | Bour et al. | |
| 2013/0228809 A1* | 9/2013 | Chang et al. | 257/98 |

FOREIGN PATENT DOCUMENTS

| | | |
|---|---|---|
| CN | 102034907 A | 4/2011 |
| TW | 200832740 | 1/2007 |
| TW | 200737538 | 10/2007 |

OTHER PUBLICATIONS

Merriam-Webster, Definition of "Arc", Retrieved Aug. 22, 2014, http://www.merriam-webster.com/dictionary/arc.*

* cited by examiner

*Primary Examiner* — Tucker Wright
(74) *Attorney, Agent, or Firm* — Moser Taboada

(57) ABSTRACT

An epitaxial growth method includes the steps of: providing a substrate; forming a sacrifice layer on the substrate; patterning the sacrifice layer to form a plurality of bumps spaced apart from each other on the substrate; epitaxially forming a first epitaxial layer on the substrate to cover a portion of each of the bumps; removing the bumps to form a plurality of cavities; and epitaxially forming a second epitaxial layer on the first epitaxial layer such that the cavities are enclosed by the first epitaxial layer and the second epitaxial layer. An epitaxial structure grown by the method is disclosed as well.

6 Claims, 8 Drawing Sheets

EPITAXIAL STRUCTURE AND EPITAXIAL GROWTH METHOD FOR FORMING EPITAXIAL LAYER WITH CAVITIES

RELATED APPLICATIONS

This application claims priority to Taiwan Application Serial Number 101124450, filed Jul. 6, 2012, which is herein incorporated by reference.

BACKGROUND

1. Technical Field

The present disclosure relates to an epitaxial structures and an epitaxial growth method for forming an epitaxial layer with cavities.

2. Description of Related Art

There has been rapid progress in technologies of light emitting diodes (LEDs) in recent years. For the purpose of increasing the light-extraction ratio of LEDs, techniques such as patterned sapphire substrates have been widely applied in LEDs, which include gallium nitride. For further increasing the light-extraction ratio, it have been purposed to form cavities or pores in epitaxial gallium nitride layers of LEDs. In this regard, it is difficult to well control the shape and the volume of the cavities in LEDs, and therefore the quality of LEDs is unstable in prior art. In view of the above, there exists a need of a new method that would improve the drawbacks in prior art.

SUMMARY

An epitaxial growth method for forming an epitaxial layer with cavities is provided. The method includes the steps of: providing a substrate; forming a sacrifice layer on the substrate; patterning the sacrifice layer to form a plurality of bumps spaced apart from each other on the substrate, wherein a portion of the substrate between the bumps is exposed; epitaxially forming a first epitaxial layer on the exposed portion of the substrate, wherein the first epitaxial layer covers a portion of each of the bumps, and a top surface of each of the bump is exposed; removing the bumps to form a plurality of cavities; and epitaxially forming a second epitaxial layer on the first epitaxial layer such that the cavities are enclosed by the first epitaxial layer and the second epitaxial layer.

According to one embodiment of the present disclosure, the substrate is a sapphire substrate or a silicon substrate.

According to one embodiment of the present disclosure, the first epitaxial layer comprises a group III nitride semiconductor.

According to one embodiment of the present disclosure, the second epitaxial layer comprises a group III nitride semiconductor.

According to one embodiment of the present disclosure, each of the first and the second epitaxial layers comprises gallium nitride.

According to one embodiment of the present disclosure, each of the first and the second epitaxial layers is formed by a hydride vapor phase epitaxy process, a metal organic chemical vapor deposition process or a molecular beam epitaxy process.

According to one embodiment of the present disclosure, a horizontal growth rate of the second epitaxial layer is greater than a horizontal growth rate of the first epitaxial layer.

According to one embodiment of the present disclosure, a temperature of the second epitaxial layer in the step of epitaxially forming the second epitaxial layer is greater than a temperature of the first epitaxial layer in the step of epitaxially forming the first epitaxial layer.

According to one embodiment of the present disclosure, a pressure in the step of epitaxially forming the second epitaxial layer is less than a pressure in the step of epitaxially forming the first epitaxial layer.

According to one embodiment of the present disclosure, the sacrifice layer is an inorganic material layer.

According to one embodiment of the present disclosure, the sacrifice layer comprises silicon oxide or silicon nitride.

According to one embodiment of the present disclosure, each of the bumps has a maximum height of about 0.5 µm to about 3 µm, and each of the bumps has a bottom width of about 0.5 µm to about 5 µm.

According to one embodiment of the present disclosure, each of the bumps has a taper angle of less than or equal to about 90 degrees in the step of forming the bumps.

According to one embodiment of the present disclosure, the step of patterning the sacrifice layer comprises etching the sacrifice layer by a process of inductively coupled plasma reactive ion etching (ICP-RIE).

According to one embodiment of the present disclosure, each of the bumps is removed by a wet etching process.

According to one embodiment of the present disclosure, an etchant of the wet etching process comprises ammonium fluoride ($NH_4F$) and hydrogen fluoride (HF).

According to one embodiment of the present disclosure, each of the cavities has an opening, and an area of the opening is about 5% to about 50% of an bottom area of each of the cavities in the step of removing the bumps to form the cavities.

According to one embodiment of the present disclosure, the substrate comprises a buffer layer formed thereon.

According to another aspect of the present disclosure, an epitaxial structure is provided. The epitaxial structure includes a substrate, a first epitaxial layer, a second epitaxial layer and a closed air void. The first epitaxial layer is disposed over the substrate. The second epitaxial layer is disposed on the first epitaxial layer. The closed air void is embedded in the first epitaxial layer and the second epitaxial layer. The closed air void has a bottom portion and a top portion respectively formed in the first epitaxial layer and the second epitaxial layer, and a width of the top portion is less than a width of the bottom portion.

In one embodiment of the present disclosure, the top portion of the closed air void includes an arc surface, and the bottom portion of the closed air void is a substantially flat surface.

In one embodiment of the present disclosure, the closed air void has a cross-section in a shape of trapezium.

In one embodiment of the present disclosure, the closed air void includes a stair-like sidewall, and the top portion and the bottom portion are two opposite flat surfaces.

In one embodiment of the present disclosure, the epitaxial structure further includes a buffer layer disposed between the substrate and the first epitaxial layer, and the bottom portion of the closed air void is formed on the buffer layer.

In one embodiment of the present disclosure, the epitaxial structure further includes a patterned sacrifice layer disposed on the substrate, and a top surface of the patterned sacrifice layer forms the bottom portion of the closed air void.

In one embodiment of the present disclosure, the closed air void has a height of about 0.5 µm to about 3 µm, the bottom portion of the closed air void has a width of about 0.5 µm to about 5 µm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
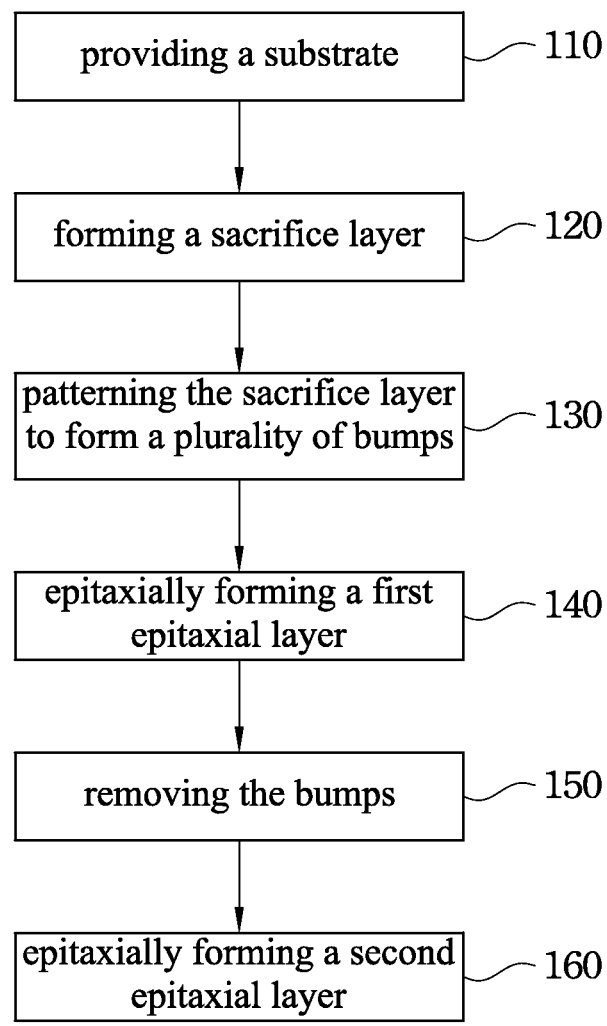
FIG. 1 is a flow chart showing an epitaxial growth method according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts. In the following detailed description, for purposes of explanation, numerous specific details are set forth in order to provide a thorough understanding of the disclosed embodiments. However, it will be apparent, that one or more embodiments may be practiced without these specific details. In other instances, well-known structures and devices are schematically shown in order to simplify the drawings.

FIG. 1 is a flow chart showing an epitaxial growth method 100 according to one embodiment of the present disclosure. The method 100 at least includes step 110 to step 160. FIG. 2A to FIG. 2F are cross-sectional views illustrating the process steps of the epitaxial growth method 100. The epitaxial growth method 100 disclosed herein may be applied in manufacturing LEDs or flat display panels.

Figure 2A:
FIG. 2A to FIG. 2F are cross-sectional views illustrating the process steps of the epitaxial growth method 100.

In step 110, a substrate 210 is provided, as depicted in FIG. 2A. The substrate 210 may be a sapphire substrate, a silicon substrate or other substrates suitable for epitaxial growth.

Figure 2B:
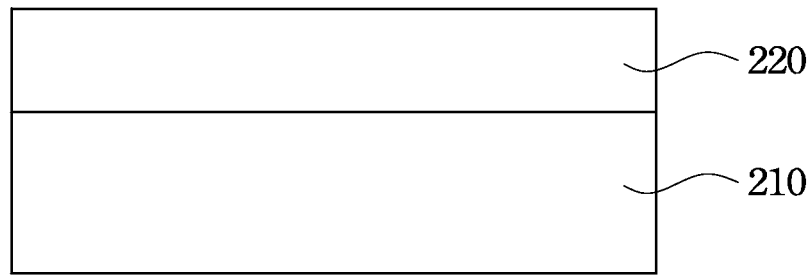

In step 120, a sacrifice layer 220 is formed on the substrate 210, as depicted in FIG. 2B. In one embodiment, the sacrifice layer 220 is a layer of inorganic material. The sacrifice layer 220 may comprise inorganic material such as silicon oxide or silicon nitride.

Figure 2C:
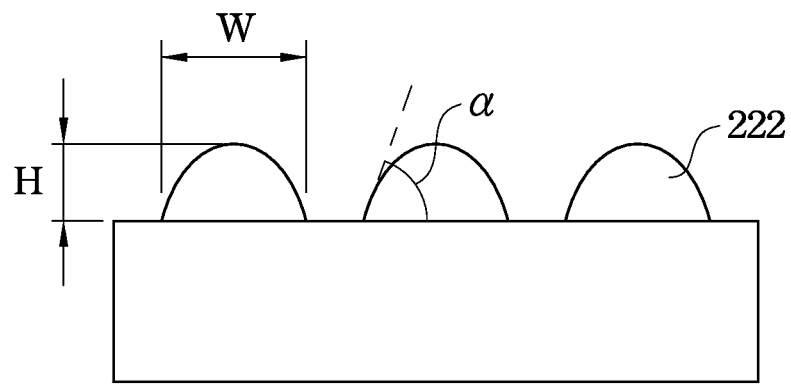

In step 130, the sacrifice layer 220 is patterned to form a plurality of bumps 222, as depicted in FIG. 2C. The bumps 222 are spaced apart from each other on the substrate 210. The spacing interval between two bumps 222 allows a surface of the substrate 210 to be exposed.

In one embodiment, a patterned photoresist layer is formed on the sacrifice layer 220, in which the photoresist layer covers the regions that are desired to form bumps 222, and the other portions of the sacrifice layer 220 is exposed. Thereafter, etching processes may be employed to remove the exposed portion of the sacrifice layer 220, and thereby forming the bumps 222. Specifically, the pattern of the photoresist layer dominates the contour of each of the bumps 222 in top view. Regarding the cross-sectional shape of each bump 222, it may be well controlled by suitable etching techniques. In one example, the exposed portion of the sacrifice layer 220 is etched by the technique of inductively coupled plasma reactive ion etching (ICP-RIE). The ICP-RIE technique may simultaneous provide anisotropic etching and isotropic etching, respectively contributed by ion bump and reactive ions, and therefore each bump 222 may be formed in a shape of hemisphere. The etching rates associated with the ion bump and the reactive ion may be respectively controlled by modulating the process parameters, and thus a variety of cross-sectional shapes of the bumps 222 may be formed. For instance, each bump 222 may have a cross-section in a shape of trapezium or rectangle, which are described in detail hereinafter.

In a preferred embodiment, a taper angle α of each of the bumps 222 is less than or equal to 90 degrees. Each of the bumps 222 has a maximum height H of about 0.5 µm to about 3 µm, and each of the bumps 222 has bottom width W of about 0.5 µm to about 5 µm. Significantly, the contours of bumps 222 dominant the shapes of the cavities formed in the following steps, which are described in detail hereinafter.

Figure 2D:
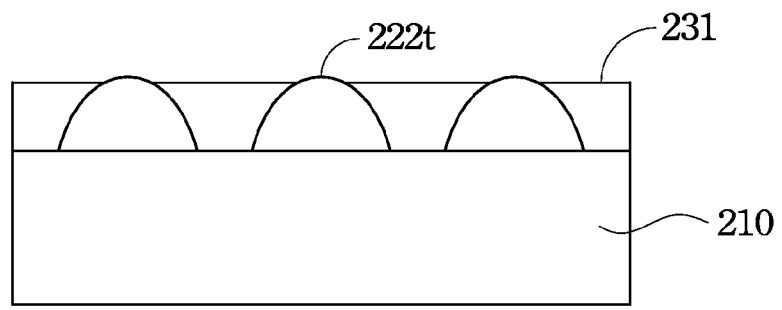

In step 140, as shown in FIG. 2D, a first epitaxial layer 231 is epitaxially formed on the exposed portion of the substrate 210 such that the first epitaxial layer 231 covers a portion of each of the bumps 222, but a top surface 222t of each of the bumps 222 is exposed out of the first epitaxial layer 231. In particular, when the first epitaxial layer 231 is epitaxially grown, the first epitaxial layer 231 crawls along the surface of the bump 222. The first epitaxial layer 231 would completely covers the bumps 222 if the process of the epitaxial growth is not stopped. Accordingly, one feature of the present disclosure relays on that the epitaxial growth of the first epitaxial layer 231 is sopped before the first epitaxial layer 231 completely covers the bumps 222 so that the top surface 222t of each of the bumps 222 is exposed out of the first epitaxial layer 231.

In one embodiment, the first epitaxial layer 231 includes a group III-nitride semiconductor, such as gallium nitride. The first epitaxial layer 231 may be formed by techniques such as hydride vapor phase epitaxy processes, metal organic chemical vapor deposition processes or molecular beam epitaxy processes.

Figure 2E:
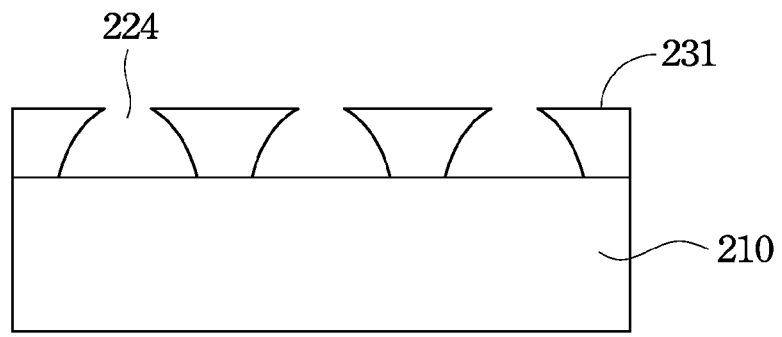

In step 150, the bumps 222 are removed by etching approaches to form a plurality of cavities 224 exposing a surface of the substrate 210, as depicted in FIG. 2E. Since the top surface 222t of each of the bumps 222 is exposed out of the first epitaxial layer 231, the bumps 222 may be removed by wet etching processes. For instance, the etchant may be a mixed solution containing ammonium fluoride ($NH_4F$) and hydrogen fluoride (HF). Significantly, the position, volume and shape of the cavities 224 substantially depend upon that of the bumps 222 as well as the coverage level that the first epitaxial layer 231 covers the bumps 222. Accordingly, the morphologies of the cavities 224 are controlled in advance of step 140 because the shape and the volume of each of the bumps 222 as well as the arrangement of these bumps 222 are precisely controlled in step 130 by the process of patterning the sacrifice layer 220, according to the embodiments of the present disclosure.

Figure 2F:
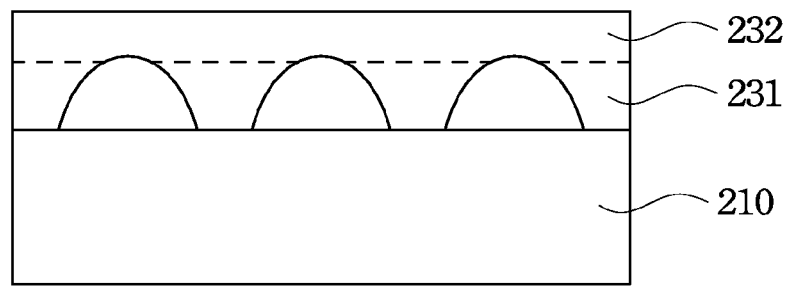
Figure 2G:
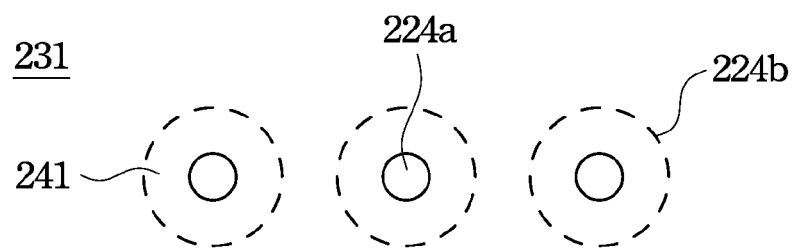
FIG. 2G is a top view schematically illustrating the cavities formed in step 150 according to one embodiment of the present disclosure.

FIG. 2G is a top view schematically illustrating the cavities 224 formed in step 150 according to one embodiment of the present disclosure. In this embodiment, when the bumps 222 are removed, each of the cavities 224 has an opening 224a and a bottom portion 224b, in which the area of each of the openings 224a is about 5% to about 50% of the area of the corresponding bottom portion 224b, specifically about 15% to about 40%. When the area of the opening 224a is less than about 5% of the area of the bottom portion 224b, it is difficult to rapidly remove the bumps 222 in step 150. On the other hands, when the area of the opening 224a is greater than about 50% of the area of the bottom portion 224b, the coverage of the first epitaxial layer 231 over the bumps 222 is insufficient and is unfavorable to the subsequent step 160. Accordingly, the area of each of the opening 224a is preferably about 5% to about 50% of the area of the corresponding bottom portion 224b, more preferably about 15% to about 40%, according to the embodiments of the present disclosure.

In step 160, a second epitaxial layer 232 is epitaxially formed on the first epitaxial layer 231 such that the cavities 224 are enclosed by the first epitaxial layer 231 and the second epitaxial layer 232, as shown in FIG. 2F. In other words, by epitaxially forming the second epitaxial layer 232, the cavities 224 become closed air voids embedded in the first epitaxial layer 231 and the second epitaxial layer 232. The method of forming the second epitaxial layer 232 may be the same as these described hereinbefore in connection with the first epitaxial layer 231. In one embodiment, the second epitaxial layer 232 includes a group III nitride semiconductor. In one example, the material of the second epitaxial layer 232 may be the same as that of the first epitaxial layer 231. For example, both the first and the second epitaxial layer 231, 232 may be made of gallium nitride. In other embodiments, the refractive index of the second epitaxial layer 232 may be different from that of the first epitaxial layer 231 when taking the entire optical path into consideration.

In another embodiment, the horizontal growth rate in the growth of the second epitaxial layer 232 is greater than the horizontal growth rate in the growth of the first epitaxial layer 231. The horizontal growth rate may be controlled by the temperature and the pressure of the epitaxial growth process. In one example, a temperature of the second epitaxial layer 232 in the growth of the second epitaxial layer 232 is greater than a temperature of the first epitaxial layer 231 in the growth of the first epitaxial layer 231, and a pressure of forming the second epitaxial layer 232 is less than a pressure of forming the first epitaxial layer 231. In other words, the first epitaxial layer 231 is epitaxially grown in an environment at a low temperature and under a high pressure such that the first epitaxial layer 231 has a better three-dimensional structure. As compared to the first epitaxial layer 231, the second epitaxial layer 232 is epitaxially grown in an environment at a higher temperature and under a lower pressure, such that the formation of the second epitaxial layer 232 exhibits an excellent planar characteristic and a rapid growth rate in a horizontal direction.

Figure 3A:
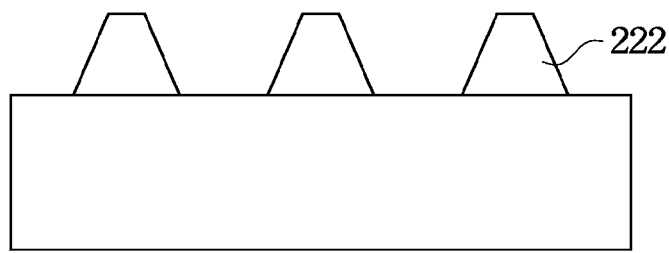
FIG. 3A to FIG. 3D are cross-sectional views illustrating the process steps of an epitaxial growth method according to another embodiment of the present disclosure.
Figure 3B:
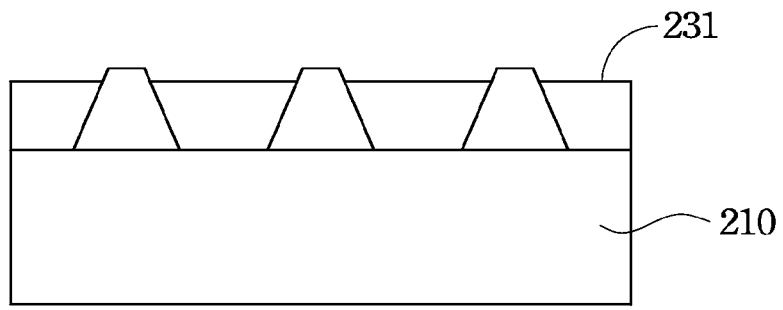
Figure 3C:
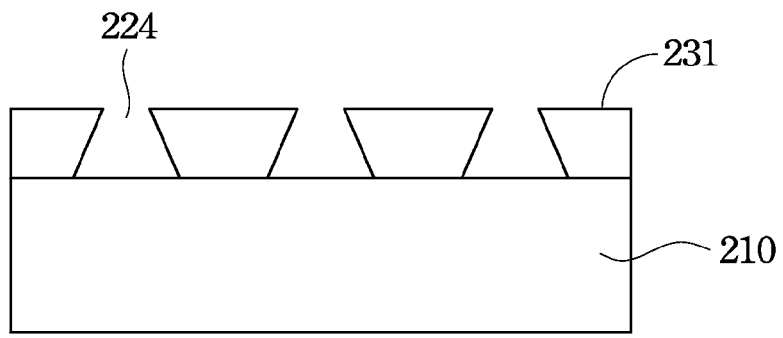
Figure 3D:
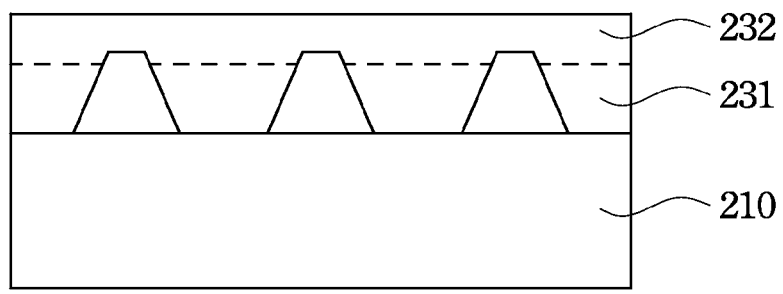
Figure 3E:
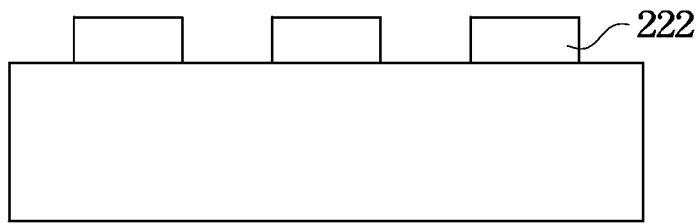
FIG. 3E to FIG. 3H are cross-sectional views illustrating the process steps of an epitaxial growth method according to still another embodiment of the present disclosure.
Figure 3F:
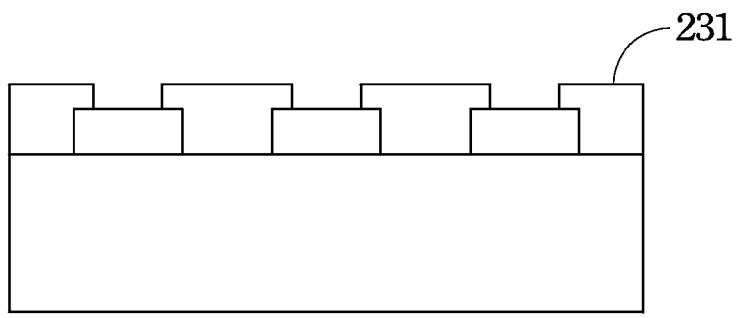
Figure 3G:
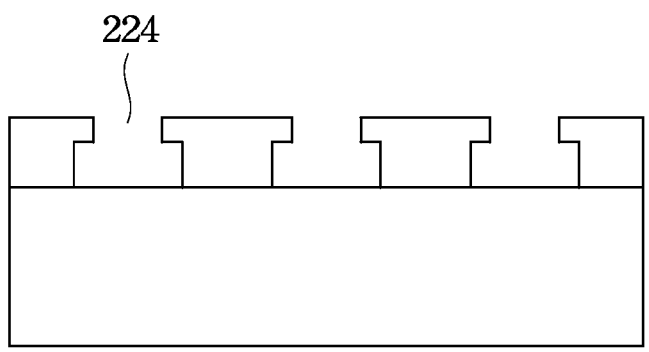
Figure 3H:
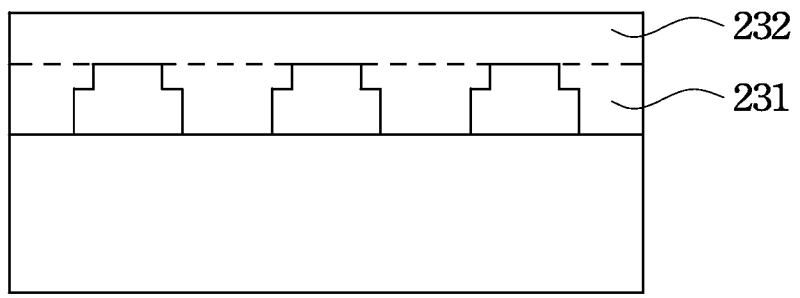

As described hereinbefore in connection with step 130 and step 140, the cavities 224 may be formed in a variety of shapes by controlling the contours and the cross-sectional shapes of the bumps 222. FIG. 3A to FIG. 3D are cross-sectional views illustrating the process steps of an epitaxial growth method according to another embodiment of the present disclosure. In the embodiment shown in FIG. 3A to FIG. 3D, a number of bumps 222, each having a trapezoidal cross-section, are formed, as shown in FIG. 3A. Thereafter, a first epitaxial layer 231 is epitaxially formed to cover a portion of each of the bumps 222, as shown in FIG. 3B. Subsequently, the bumps 222 are removed to form a plurality of cavities 224, as shown in FIG. 3C. And then, a second epitaxial layer 232 is epitaxi- ally formed on the first epitaxial layer 231 to enclose the cavities 224 with trapezoidal cross-sections, as shown in FIG. 3D. Similarly, the embodiment shown in FIG. 3E to FIG. 3H, the cross-sections of the cavities 224 may be formed like stair.

Figure 4A:
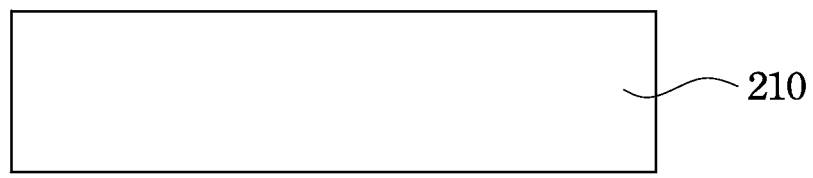
FIG. 4A to 4F are cross-sectional views illustrating the process steps of an epitaxial growth method according to still another embodiment of the present disclosure.
Figure 4B:
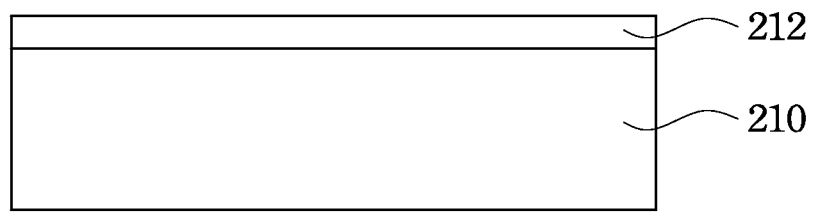
Figure 4C:
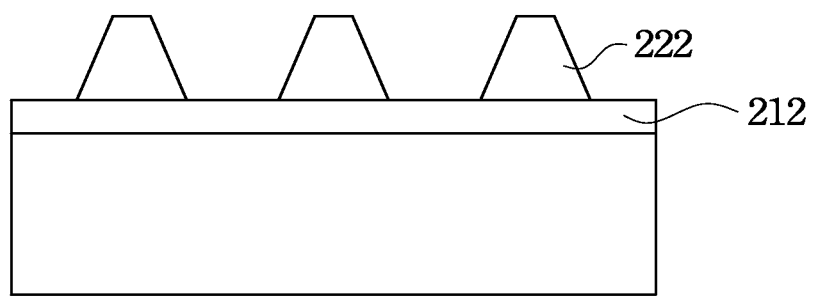
Figure 4D:
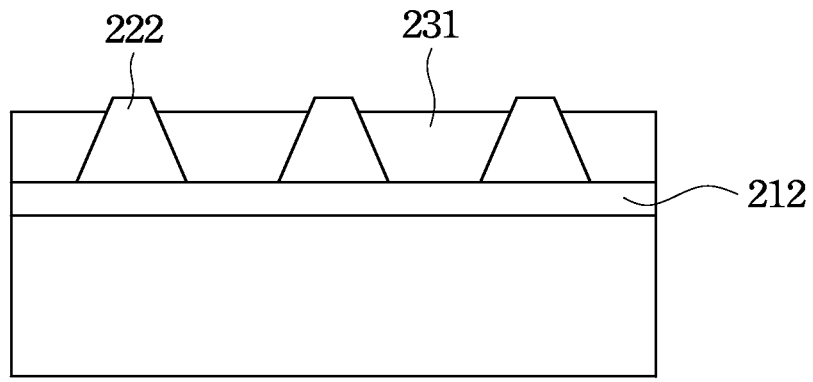
Figure 4E:
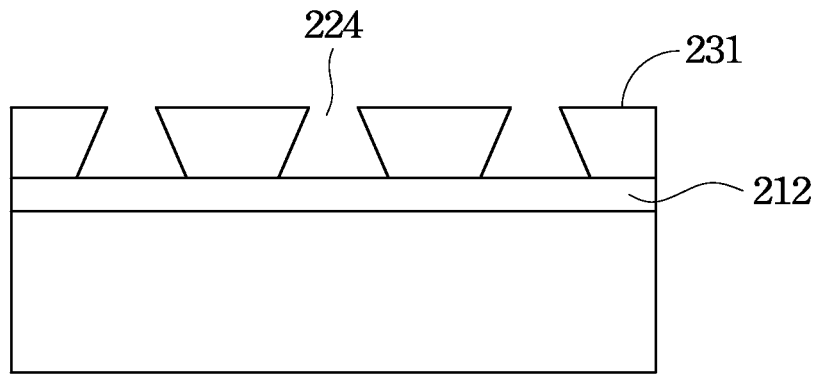
Figure 4F:
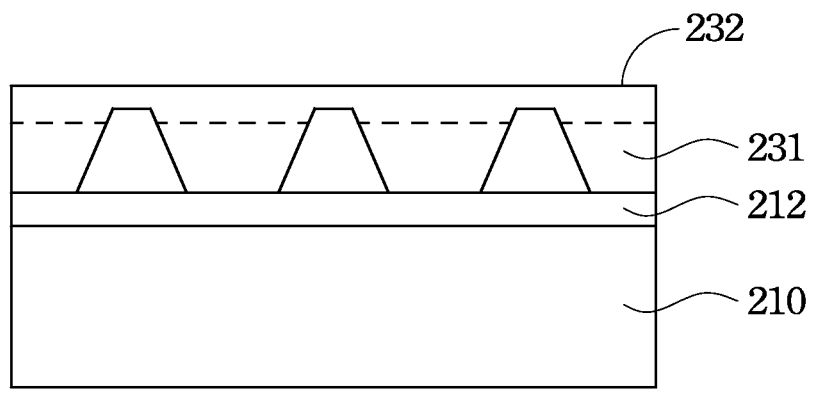

FIG. 4A to 4F are cross-sectional views illustrating the process steps of an epitaxial growth method according to still another embodiment of the present disclosure. In FIG. 4A, a substrate 210 is provided. In FIG. 4B, a buffer layer 212 is formed on a surface of the substrate 210. In FIG. 4C, a plurality of bumps 222 are formed on the buffer layer 212. Thereafter, as shown in FIG. 4D, a first epitaxial layer 231 is epitaxially formed on the buffer layer 212. Subsequently, as shown in FIG. 4E, the bumps 222 are removed to form a plurality of the cavities 224. And then, as shown in FIG. 3D, a second epitaxial layer 232 is epitaxially formed on the first epitaxial layer 231 to enclose the cavities 224.

Figure 5A:
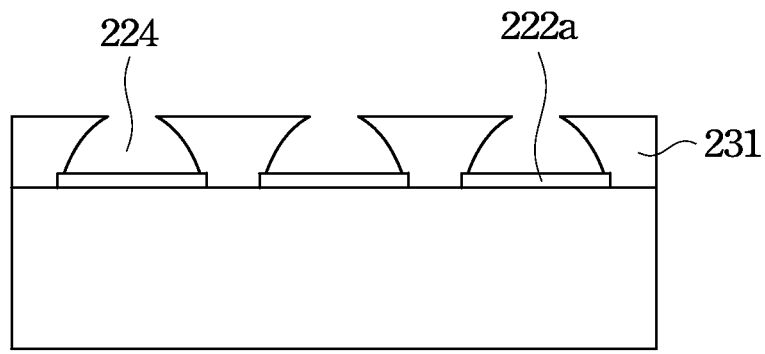
FIGS. 5A and 5B are cross-sectional views illustrating the process steps of an epitaxial growth method according to still another embodiment of the present disclosure.
Figure 5B:
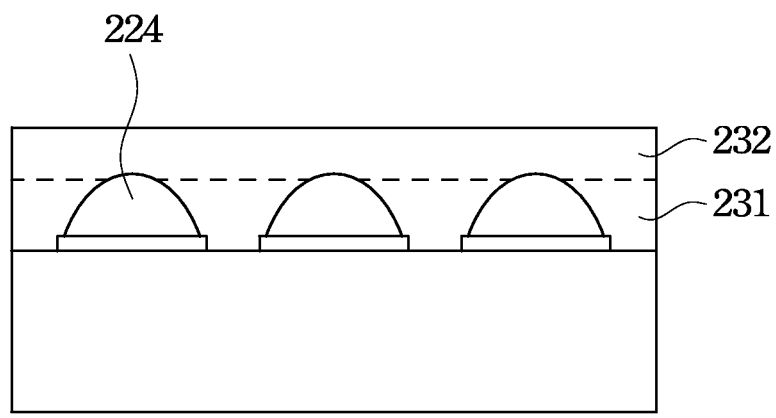

FIGS. 5A and 5B are cross-sectional views illustrating the process steps of an epitaxial growth method according to still another embodiment of the present disclosure. In this embodiment, step 110 to step 140 may be the same as these described hereinbefore in connection with FIG. 2A to FIG. 2D. Thereafter, as shown in FIG. 5A, only a portion of each of the bumps 222 is removed in step 150, and another portion of each of the bumps 222 remains. In particular, the process of etching the bumps 222 is stopped before the bumps 222 are completely removed so that a portion 222a of each of the bumps 222 is remained on the substrate. Subsequently, as shown in FIG. 5B, a second epitaxial layer 232 is epitaxially formed on the first epitaxial layer 231 in step 160 such that the cavities 224 are enclosed by the first and the second epitaxial layers 231, 232. In other words, the remained portions 222a of the bumps may be formed in the closed air voids that are embedded in the first and the second epitaxial layers 231, 232 according to this embodiment. In one example, a refractive index of the remained portions 222a of the bumps is different from that of the first epitaxial layer 231 and/or the second epitaxial layer 232, and therefore the remained portions 222a serves as an optical medium to change the optical path and the optical characteristics of the structure shown in FIG. 2F.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An epitaxial structure, comprises:
a substrate having a surface;
a first epitaxial layer disposed over the substrate and defining a plurality of curved air voids tapering away from the substrate and an opening over each of the curved air voids; and
a second epitaxial layer disposed on the first epitaxial layer and collectively defining the curved air voids in a shape of hemisphere with the surface and the first epitaxial layer.

2. The epitaxial structure according to claim 1, further comprises a buffer layer disposed between the substrate and the first epitaxial layer, and the bottom portion of the closed air void is formed on the buffer layer.

3. The epitaxial structure according to claim 1, further comprises a patterned sacrifice layer disposed on the substrate, and a top surface of the patterned sacrifice layer forms the bottom portion of the closed air void.

4. The epitaxial structure according to claim 1, wherein the closed air void has a height of about 0.5 μm to about 3 μm, the bottom portion of the closed air void has a width of about 0.5 μm to about 5 μm.

5. The epitaxial structure according to claim 1, wherein the surface of the substrate defines a bottom portion of each of the air voids, and the second epitaxial layer defines a top portion of each of the air voids.

6. The epitaxial structure according to claim 5, wherein each of the openings encloses an area accounting for 15-40% of an area of the bottom portion.

* * * * *